(12) United States Patent
Kapil et al.

(10) Patent No.: US 11,863,177 B2
(45) Date of Patent: Jan. 2, 2024

(54) H-BRIDGE DRIVER WITH OUTPUT SIGNAL COMPENSATION

(71) Applicant: TEXAS INSTRUMENTS INCORPORATED, Dallas, TX (US)

(72) Inventors: Jitender Kapil, Bangalore (IN); Deep Banerjee, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 17/515,804

(22) Filed: Nov. 1, 2021

(65) Prior Publication Data

US 2023/0132605 A1 May 4, 2023

(51) Int. Cl.
H03K 19/017 (2006.01)
H03K 19/17784 (2020.01)
H03K 19/084 (2006.01)
H03K 19/17736 (2020.01)

(52) U.S. Cl.
CPC ..... *H03K 19/01742* (2013.01); *H03K 19/084* (2013.01); *H03K 19/1774* (2013.01); *H03K 19/17784* (2013.01)

(58) Field of Classification Search
CPC ............ H03K 19/00; H03K 19/01742; H03K 19/084; H03K 19/1774; H03K 19/17784
USPC .......................................................... 327/108
See application file for complete search history.

(56) References Cited

U.S. PATENT DOCUMENTS

| 6,512,645 | B1* | 1/2003 | Patti ......................... G11B 5/02 360/68 |
| 7,800,413 | B2* | 9/2010 | Lee ....................... G09G 3/3611 327/108 |
| 2008/0204914 | A1* | 8/2008 | Hashizume ............ G11B 5/022 360/68 |
| 2022/0094779 | A1* | 3/2022 | Choulos ................ H04M 3/007 |

OTHER PUBLICATIONS

SP4023-01FTG-C—Littelfuse. (n.d.). https://www.littelfuse.com/products/tvs-diode-arrays/lightning-surge-protection/sp4023/sp4023_01ftg_c.aspx, © 2020 Littelfuse, Inc. Revised: Apr. 1, 2020, retrieved Dec. 22, 2022 (Year: 2020).*

* cited by examiner

*Primary Examiner* — Thomas J. Hiltunen
(74) *Attorney, Agent, or Firm* — Valerie M. Davis; Frank D. Cimino

(57) ABSTRACT

In an example driver circuit, one of two current sources coupled between a supply voltage and one output node is disabled during a driver disable time period (tpz) while the other continues to operate during a pre-charge monopulse time period (td) within tpz. A third current source on the other side of the driver circuit and coupled to ground is also disabled during tpz. During td, the following components are enabled: a charge current source coupled between the supply voltage and a second output node; a pair of current switches respectively coupled to the output nodes; and a pair of pull-down switches respectively coupled to control terminals of the current switches. After tpz, during a compensation time period (tcomp), the current sources enabled during td are disabled and a compensation current source is enabled. After tcomp, the compensation current source is disabled.

21 Claims, 5 Drawing Sheets

H-BRIDGE DRIVER WITH OUTPUT SIGNAL COMPENSATION

FIELD OF DISCLOSURE

This disclosure relates generally to H-bridge drivers, and more particularly to H-bridge drivers configured with structures and functionality to mitigate or eliminate differential output polarity reversal that may occur under certain operating conditions.

BACKGROUND

An H-bridge is an electronic circuit that switches the polarity of a voltage that is applied to a load. H-bridges are used, for example, in electric-motor-based applications, such as robotics. An H-bridge may be used to control the flow of current to allow the electric motor to run in the forward and reverse directions.

A standard H-bridge-based driver (e.g., an RS-485 standard protocol driver) may include transient-voltage-suppression (TVS) diodes for surge protection of the system. However, under certain operating conditions, the polarity of the differential output voltage (VOD) flips when a driver enable signal is de-asserted to disable the driver in the presence of a high common mode load, which could potentially cause a glitch in the output to a receiver, such as a microcontroller, and disrupt communication.

During operation of a standard H-bridge driver with TVS diodes, current is steered from a P-stack on one bus output side through a common mode load and through an N-stack on the other bus output side. When the standard H-bridge is turned off and the bus output voltages discharge to the common mode load, the two TVS diode pairs discharge different amounts of reverse leakage current, generating a differential reverse leakage current that causes the polarity of the VOD to flip.

This VOD polarity flip is due in part to the design of the standard H-bridge driver. When the standard H-bridge driver is disabled, the P-stack driver and N-stack driver disable at slightly different times. During disable, as the bus output voltages discharge below 0 V, the gate-source voltage ($V_{GS}$) of a transistor-diode on one output node is greater than $V_{GS}$ of a transistor-diode on the other output node. This creates unequal reverse leakage currents through the respective TVS diode pairs. This differential reverse leakage current initiates the VOD polarity flip.

Differential TVS diode capacitance discharge current contributes to keeping VOD polarity flipped for a longer period of time. As the drivers continue to discharge toward the common mode load after the driver stacks are disabled, based on the initial discharge voltages on the output nodes, the floating middle nodes of the respective two TVS diode pairs have different voltages. Hence, the different TVS diode pair capacitances generate different discharging currents, which maintains the VOD polarity flip for additional time.

A solution to this VOD polarity flip issue is thus desirable.

SUMMARY

In accordance with an example, a driver circuit comprises at least one current source (e.g., current source 142 and/or 144), coupled between a supply voltage terminal (e.g., Vcc) and a first output node (e.g., Y) of the driver circuit. These current source(s) are configured to supply a charge current during a pre-charge monopulse time period (e.g., $t_d$) during and less than a driver disable time period (e.g., $t_{pz}$) when the driver circuit is disabled. The supplied charge current is less than a current supplied by the current source(s) when the driver circuit is enabled. The driver circuit comprises another current source (e.g., current source 124) coupled to a ground terminal of the driver circuit, which current source is configured to be disabled during the driver disable time period, and a charge current source (e.g., current source 154) coupled between the supply voltage terminal and a second output node (e.g., Z) of the driver circuit, which current source is configured to be enabled during the pre-charge monopulse time period. The driver circuit comprises a first current switch (e.g., $M_{Y\_NDiode}$) coupled to the first output node, the first current switch having a control terminal and configured to be charged during the pre-charge monopulse time period, and a second current switch (e.g., $M_{Z\_NDiode}$) coupled to the second output node and to the third current source, the second current switch having a control terminal and configured to be charged during the pre-charge monopulse time period. A first pull-down switch of the driver circuit is coupled between the control terminal of the first current switch and ground, and a second pull-down switch of the driver circuit is coupled between the control terminal of the second current switch and ground. Each pull-down switch is configured to be activated during the pre-charge monopulse time period.

In accordance with an example, a driver circuit comprises first and second current switches (e.g., $M_{Y\_NDiode}$ and $M_{Z\_NDiode}$); a first charge current source (e.g., current source 142 and/or current source 144) configured to deliver a charge current during a pre-charge monopulse time period (e.g., $t_d$) during and less than a driver disable time period (e.g., $t_{pz}$) when the driver circuit is disabled, and a second charge current source (e.g., current source 154) configured to be enabled during the pre-charge monopulse time period. The first and second charge current sources are configured to charge the first and second current switches during the pre-charge monopulse time period. The driver circuit comprises first and second pull-down switches coupled to the first and second current switches, respectively. The first and second pull-down switches are configured to be enabled during the pre-charge monopulse time period to discharge internal voltages of the first and second current switches, respectively.

In accordance with an example, a method comprises disabling, for a first time period (e.g., $t_{pz}$), a first current source (e.g., current source 142) coupled to a first current switch (e.g., $M_{Y\_NDiode}$) at a first output node (e.g., Y) of a driver circuit; disabling, for the first time period, a second current source (e.g., current source 124) coupled to a second current switch (e.g., $M_{Z\_NDiode}$) at a ground terminal of the driver circuit; enabling, for a second time period (e.g., $t_d$) during and less than the first time period, a third current source (e.g., current source 154) coupled to the second current switch at a second output node (e.g., Z) of the driver circuit; operating, for the second time period, a fourth current source (e.g., current source 144) coupled to the first current switch at the first output node; enabling, for the second time period, a first pull-down switch coupled between the first current switch and the ground terminal; and enabling, for the second time period, a second pull-down switch coupled between the second current switch and the ground terminal.

These and other features will be better understood from the following detailed description with reference to the accompanying drawings.

BRIEF DESCRIPTION OF THE DRAWINGS

Features of the disclosure may be understood from the following figures taken in conjunction with the detailed description.

The same reference numbers are used in the drawings to designate the same or similar (structurally and/or functionally) features.

DETAILED DESCRIPTION

Figure 1:
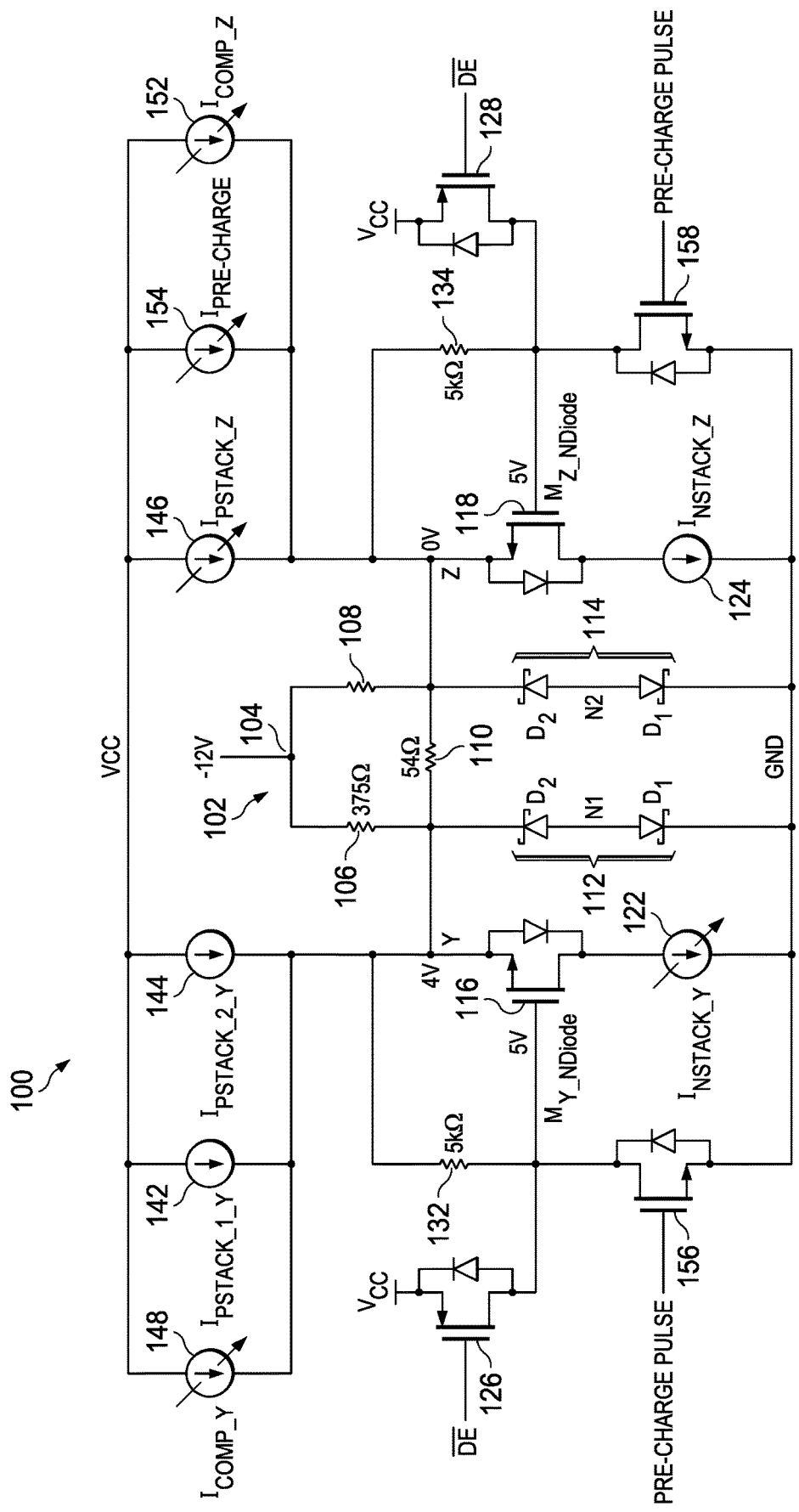
FIG. 1 is a circuit diagram of an example H-bridge driver with a common mode load.

Specific examples are described in detail below with reference to the accompanying figures. These examples are not intended to be limiting. In the drawings, corresponding numerals and symbols generally refer to corresponding parts unless otherwise indicated. The objects depicted in the drawings are not necessarily drawn to scale, and graphs are approximate representations.

In examples, structure and/or functionality is provided to reduce or eliminate differential reverse leakage and/or discharge capacitance current in H-bridge drivers and similarly constructed components. In examples, such structure and/or functionality is enabled during driver disable or mode change in an H-bridge driver half-duplex configuration. In examples, the polarity flip of the output voltage, during disable or mode change, is mitigated or eliminated to improve communication between an H-bridge driver and downstream components, e.g., a microcontroller.

FIG. 1 is a circuit diagram of an example H-bridge driver 100 with a common mode load 102. Common mode load 102 may include a common mode voltage, e.g., −12 V, at a voltage terminal 104, and a resistive network that includes resistors 106 and 108, each of which is coupled to voltage terminal 104, and a resistor 110. Resistors 106 and 108 also coupled to bus output nodes Y and Z, respectively, which output nodes are bridged by resistor 110. Resistors 106 and 108 may each be approximately 375Ω, and resistor 110 may be approximately 54Ω.

Coupled between the Y bus output node and ground (GND) is a first pair of transient-voltage-suppression (TVS) diodes 112. A second pair of TVS diodes 114 is coupled between the Z output node and ground. Each TVS diode pair 112, 114 is comprised of two diodes coupled back-to-back. The node between the two diodes of pair 112 is denoted N1, and the node between the two diodes of pair 114 is denoted N2.

First and second current switches 116 and 118 are coupled to bus output nodes Y and Z, respectively. Each of switches 116 and 118 may be comprised of an n-type metal-oxide-semiconductor field-effect transistor (MOSFET) and a diode coupled between the drain and source of the n-type MOSFET. The source of first current switch 116 ($M_{Y\_NDiode}$) is coupled to the Y bus output node, and the source of second current switch 118 ($M_{Z\_NDiode}$) is coupled to the Z bus output node. The drain of current switch 116 is coupled to an N stack, Y side current source 122 ($I_{NSTACK\_Y}$), and the drain of current switch 118 is coupled to an N stack, Z side current source 124 ($I_{NSTACK\_Z}$). Each of current sources 122 and 124 is also coupled to ground.

The control terminals (e.g., gates) of first and second current switches 116 and 118 are controlled by first and second control switches 126 and 128, respectively. Each of control switches 126 and 128 may be comprised of a p-type MOSFET and a diode coupled between the drain and source of the p-type MOSFET. The drain of control switch 126 is coupled to the control terminal of current switch 116, and the drain of control switch 128 is coupled to the control terminal of current switch 118. The sources of control switches 126 and 128 are coupled to a power supply terminal ($V_{cc}$). The gate of each of control switches 126 and 128 is controlled by input signal DE, which is the inverted signal of driver enable DE signal.

A resistor 132 is coupled between the control terminal (e.g., gate) and source of current switch 116, and a resistor 134 is coupled between the control terminal (e.g., gate) and source of current switch 118. Each of resistor 132 and 134 may be approximately 5 kΩ.

H-bridge driver 100 also includes P stack current sources. On the Y bus output node side, there are two such current sources 142 and 144, which are configured to deliver currents $I_{PSTACK\_1\_Y}$ and $I_{PSTACK\_2\_Y}$, respectively. Each of current source 142 and 144 is coupled between the power supply terminal (e.g., $V_{cc}$) and the Y bus output node. A Z side, P stack current source 146, configured to deliver current $I_{PSTACK\_Z}$, is coupled between $V_{cc}$ and the Z bus output node.

Coupled in parallel with current sources 142 and 144 is a Y side, compensation current source 148, which is configured to deliver current $I_{COMP\_Y}$. Compensation current source 148 is coupled between $V_{cc}$ and the Y bus output node. Another compensation current source 152 on the Z side is configured to deliver current $I_{COMP\_Z}$ and is coupled between $V_{cc}$ and the Z bus output node. A pre-charge current source 154, configured to deliver current $I_{pre-charge}$, is coupled in parallel with current sources 146 and 152.

H-bridge driver 100 further includes a pair of pull-down switches 156 and 158. Each of pull-down switches 116 and 118 may be comprised of an n-type MOSFET and a diode coupled between the drain and source of the n-type MOSFET. The drain of pull-down switch 156, disposed on the Y side, is coupled to the control terminal of current switch 116, and the source of pull-down switch 156 is coupled to ground (GND). Pull-down switch 158 is similarly disposed on the Z side. That is, the drain of pull-down switch 158 is coupled to the control terminal of current switch 118, and the source of pull-down switch 158 is coupled to ground. The control terminals (e.g., gates) of pull-down switches 156 and 158 are configured to receive a pre-charge pulse to activate them and rapidly discharge voltages of current switches 116 and 118, as described below.

Figure 2:
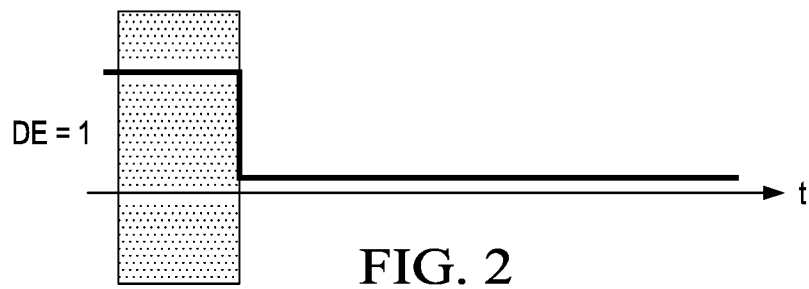
FIG. 2 shows a driver enable (DE) signal with respect to time, in which the hatched portion indicates a period during which an H-bridge driver, such as that of FIG. 1 is operating in an enabled state.

In an example, when the DE signal is asserted (DE=1) and applied to control switches 126 and 128 for a period of time, which is designated by the hatched portion in FIG. 2, H-bridge driver 100 operates in the enabled state. During this time period, based on a driver input signal (DIN), P stack current sources 142 and 144, as well as N stack current source 124, are ON. As a result, current flows from P stack current sources 142 and 144 to the Y bus output node, into common mode load 102 (across resistor 110 and also through resistors 106 and 108 toward voltage terminal 104). Current also flows into the Z bus output node, then through current switch 118, and is then discharged to ground through N stack current source 124. In an example operation during this time period (DE=1), control switches 126 and 128 are turned ON by $\overline{DE}$, which results in a voltage signal, e.g., a 5 V signal, being applied to the control terminals (e.g., gates) of current switches 116 and 118. As a result, the gate-to-source voltage ($V_{GS}$) of current switch 118 is greater than the $V_{GS}$ of current switch 116. In this example, the $V_{GS}$ of current switch 118 is approximately 5 V, while the $V_{GS}$ of current switch 116 is approximately 1 V. Also, the voltage at node N1 in TVS diode pair 112 is greater than the voltage at node N2 in TVS diode pair 114.

Figure 3:
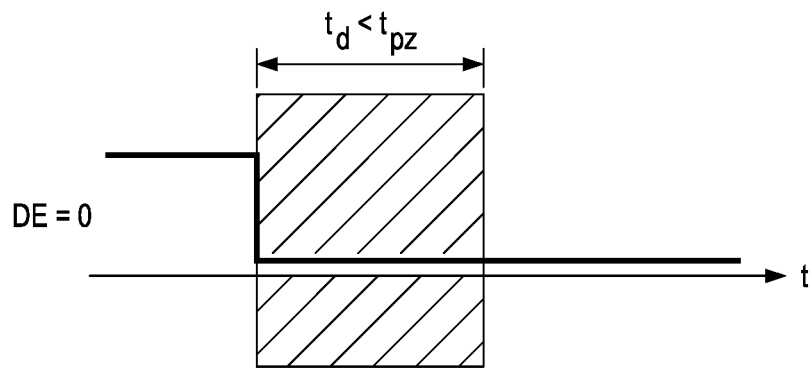
FIG. 3 shows a DE signal with respect to time, in which the hatched portion indicates a driver disable time period during which an H-bridge driver, such as that of FIG. 1, is in a disabled state.
Figure 4:
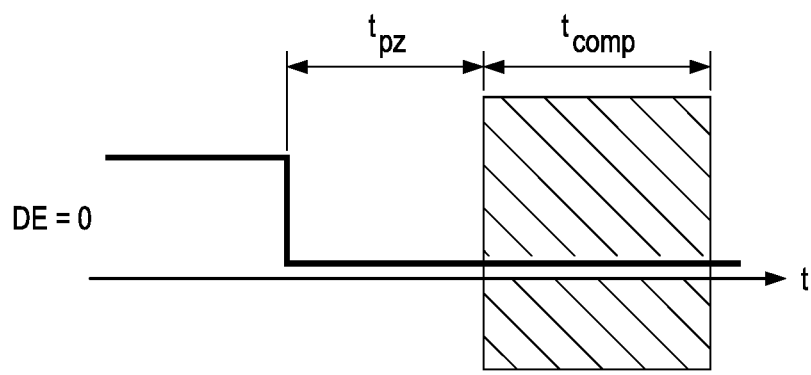
FIG. 4 shows a DE signal with respect to time, in which the hatched portion indicates a compensation time period during which compensation current is supplied to components of an H-bridge driver, such as that of FIG. 1.
Figure 5:
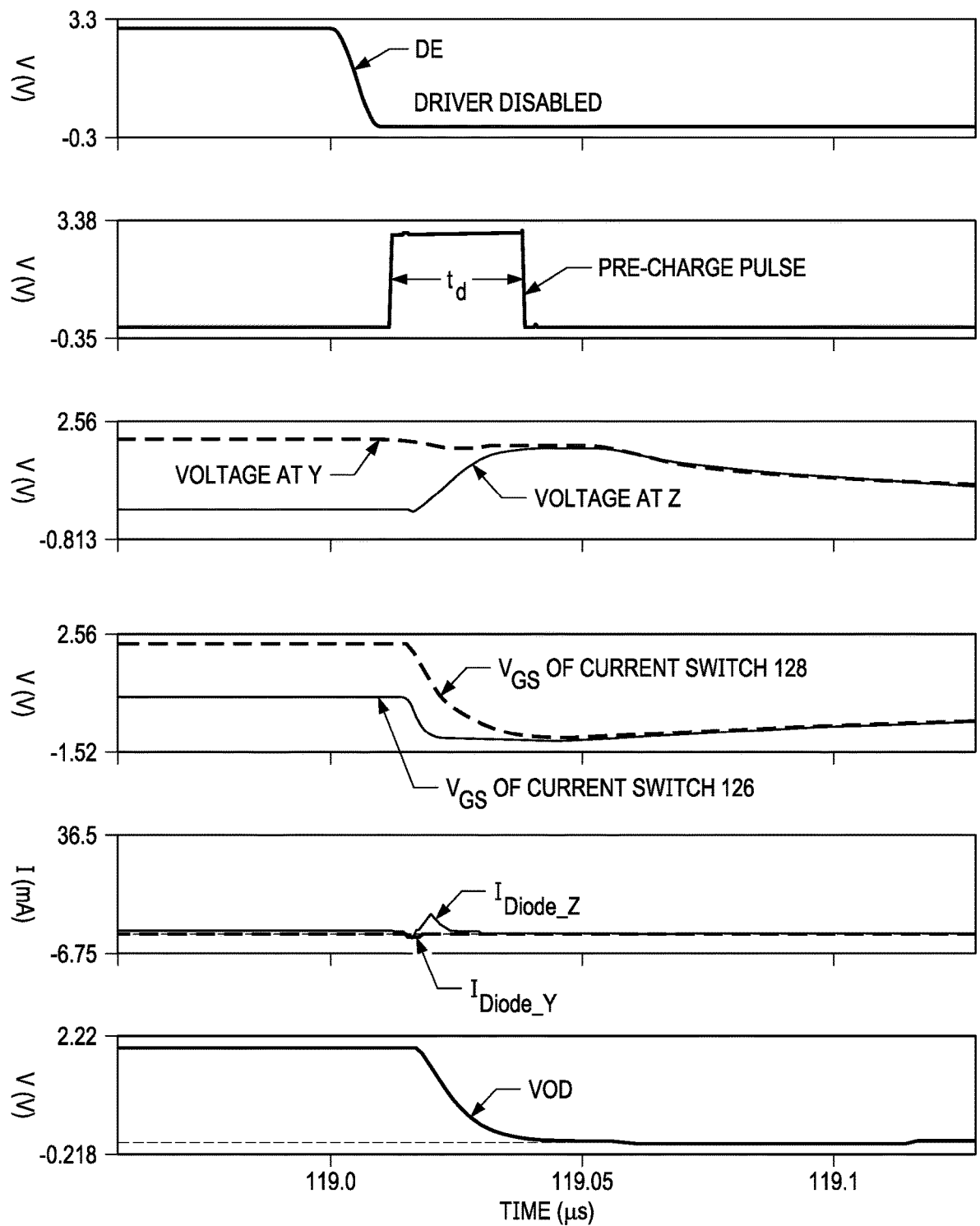
FIG. 5 shows signals after applying technique to reduce differential reverse leakage current in an example H-bridge driver.

Thus, as shown in FIGS. 3 and 5, after DE transitions (e.g., to 0) and H-bridge driver 100 enters a disabled state, a pre-charge pulse is applied to pull-down switches 156 and 158 for a pre-charge monopulse time period ($t_d$), which is within but less than a driver disable time period ($t_{pz}$), where $t_{pz}$ represents a time during which H-bridge driver 100 is disabled. Driver disable time period ($t_{pz}$) may be set in accordance with the RS-485 standard (incorporated by reference in its entirety), which is based on the maximum data rate supported by the driver. For example, for a 10 Mbps data rate driver, driver disable time period ($t_{pz}$) is 75 ns (max). Pre-charge monopulse time period ($t_d$) may be, for example, less than 50 ns across all supply, temperature and technology process corners.

The transition of DE to the disabled level (e.g., to 0) also disables one of the Y side, P stack current sources, e.g., current source 142, which is turned OFF. During the duration of the pre-charge pulse, the other Y side, P stack current source, e.g., current source 144 remains ON, continuing to deliver current $I_{PSTACK\_2\_Y}$, and pre-charge current source 154 is enabled to deliver current $I_{Pre-charge}$. In an example, current sources 144 and 154 are operated during the pre-charge monopulse time period ($t_d$), such that the current delivered by the Y side, P stack current source that remains ON, e.g., $I_{PSTACK\_2\_Y}$ from current source 144, is greater than the $I_{pre-charge}$ current (that is, $I_{PSTACK\_2\_Y} > I_{pre-charge}$). As a result, the voltage at each of the bus output nodes Y and Z is pulled to a value higher than a threshold turn-on voltage $V_{TN}$ of n-type MOSFET switches 116 and 118. Also, during the pre-charge monopulse time period ($t_d$), pull-down switches 156 and 158 are enabled via application of the discharge signal, to rapidly discharge $V_{GS}$ of each of current switches 116 and 118 to less than 0 V, as shown in FIG. 5. Thus, there is no appreciable reverse leakage current through TVS diode pairs 112 and 114. That is, $I_{Diode\_Y}$ and $I_{Diode\_Z}$, which represent the reverse leakage currents through TVS diode pairs 112 and 114, respectively, are each at or near zero, as shown in FIG. 5 and thus so is the differential reverse leakage current. As a result, as shown in FIG. 5, the differential output voltage (difference between the voltage at Y and Z, denoted VOD) remains positive; the polarity of VOD does not flip.

To maintain VOD greater than 0 V, current compensation is applied during a current compensation time period ($t_{comp}$), which occurs after the driver disable time period ($t_{pz}$) and the pre-charge monopulse time period ($t_d$) within $t_{pz}$. Compensation time period ($t_{comp}$) may be set in the range of 500 ns-600 ns. At the start of the current compensation time period ($t_{comp}$), the P stack current source that was ON in the pre-charge monopulse time period ($t_d$), e.g., current source 144, is disabled, as is pre-charge current source 154. With these current sources now disabled, voltages of the TVS diode pairs 112 and 114 discharge toward common mode load 102, decreasing the bus output node voltages, i.e., voltages at Y and Z, and generating capacitance-based discharge currents $I_{Diode\_Y}$ and $I_{Diode\_Z}$, which are typically of different values. Thus, a compensation current source is enabled during $t_{comp}$ to offset or compensate for the differential capacitance-based discharge current. Based on the value of DIN, either compensation current source 148 is enabled or compensation current source 152 is enabled. When compensation current source 148 is enabled, the current ($I_{COMP\_Y}$) it delivers is greater than the difference $I_{Diode\_Z} - I_{Diode\_Y}$ (i.e., $I_{COMP\_Y} > I_{Diode\_Z} - I_{Diode\_Y}$). When compensation current source 152 is enabled, the current ($I_{COMP\_Z}$) it delivers is greater than the difference $I_{Diode\_Y} - I_{Diode\_Z}$ (i.e., $I_{COMP\_Z} > I_{Diode\_Y} - I_{Diode\_Z}$).

Figure 6:
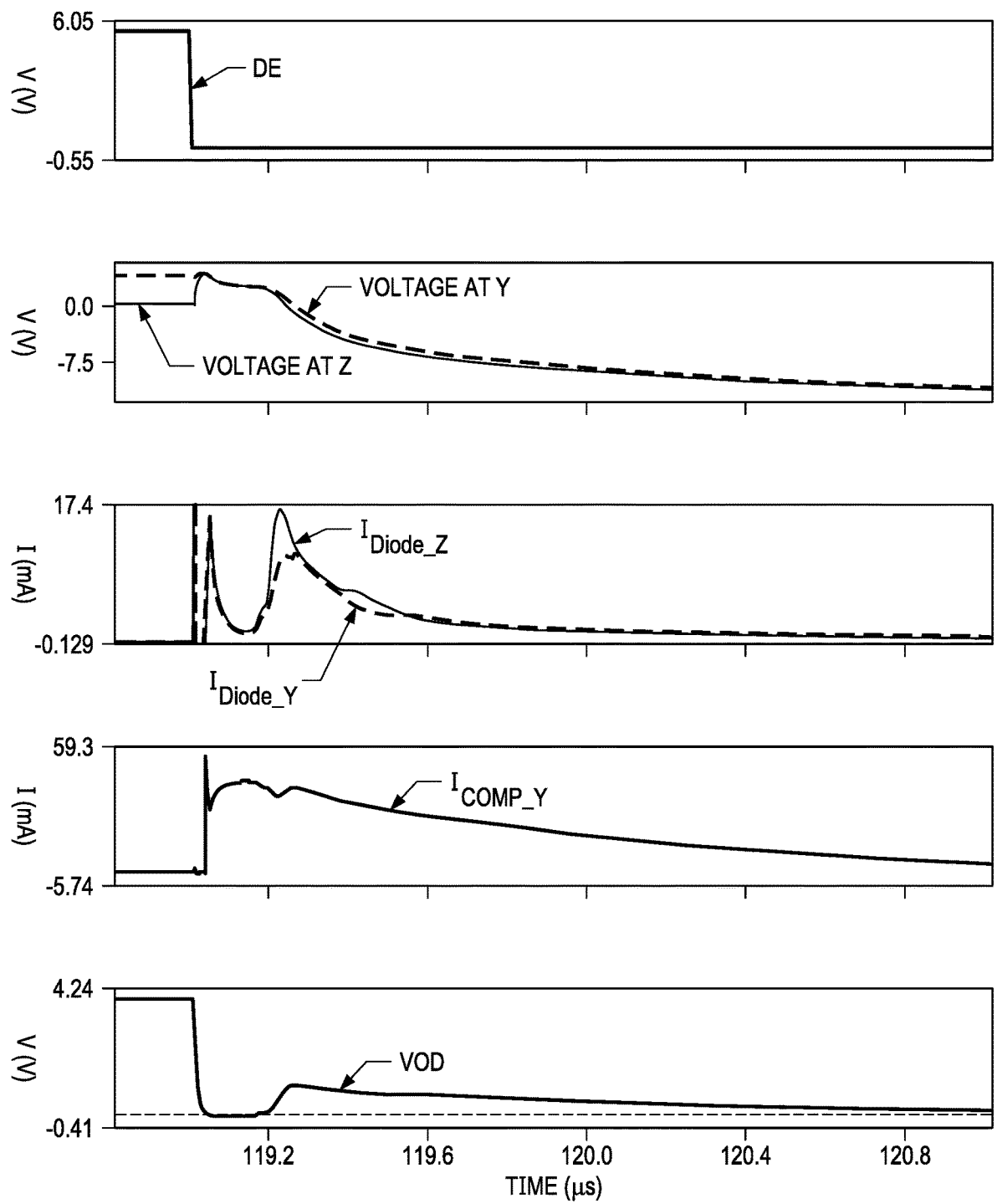
FIG. 6 shows signals after applying technique to compensate for differential TVS diode pair capacitance discharging current in an example H-bridge driver.

As shown in FIG. 6, in an example in which compensation current source 148 is enabled to deliver current $I_{COMP\_Y}$, VOD remains above 0 V, thus avoiding a polarity flip. Current compensation time period ($t_{comp}$) may be set based on the expected maximum capacitance of TVS diode pairs 112, 114. For compatibility with the RS-485 standard, $I_{COMP}$ (from either compensation current source) should not exceed 10% of the short-circuit output current ($I_{os}$). That is, $I_{COMP} < I_{os}$.

Figure 7:
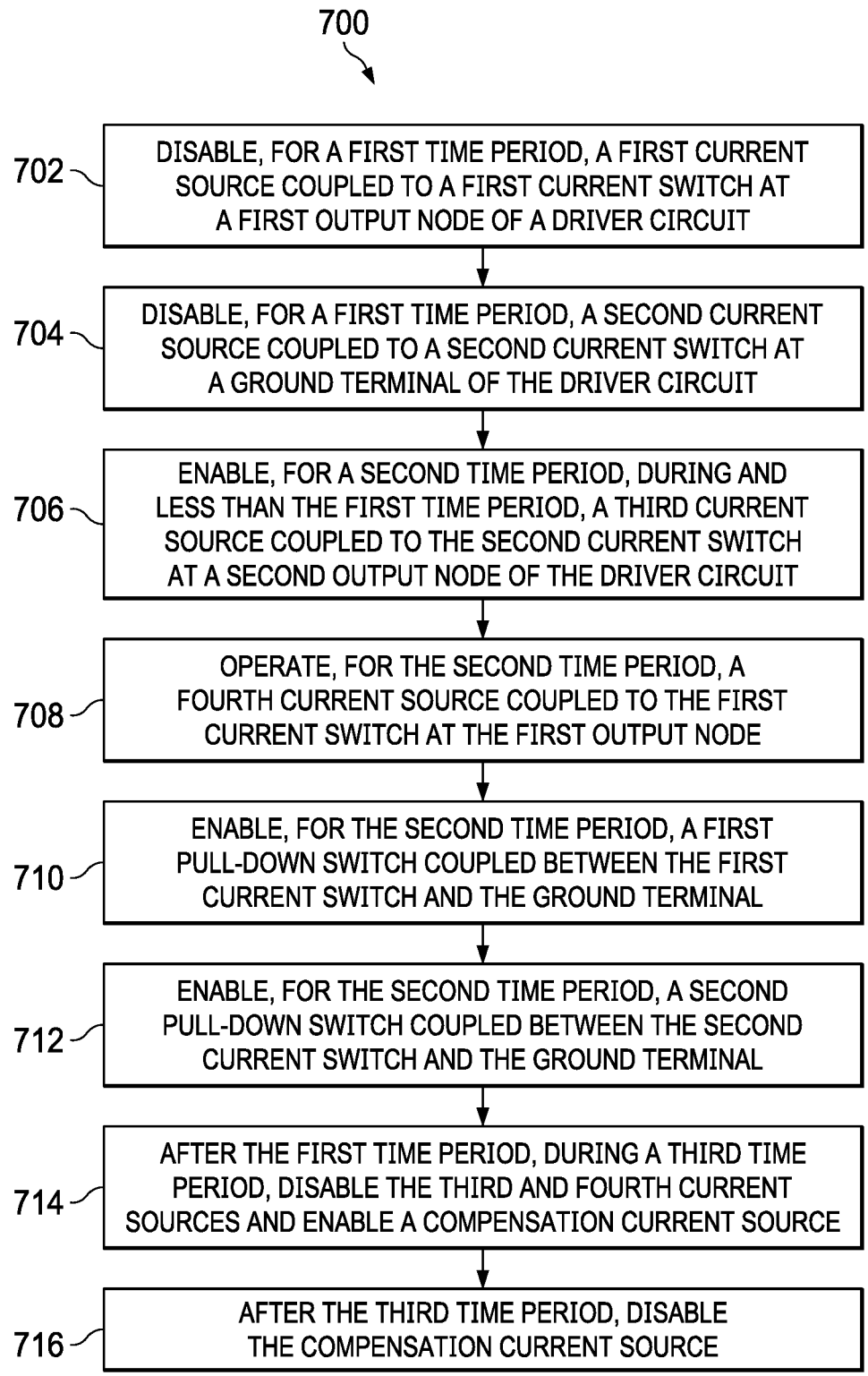
FIG. 7 is a flow diagram of an example method of operating an example H-bridge driver.

FIG. 7 is a flow diagram 700 of an example method of operating an example H-bridge driver. Operation 702 includes disabling, for a first time period (e.g., $t_{pz}$), a first current source (e.g., current source 142) coupled to a first current switch (e.g., current switch 116) at a first output node (e.g., bus output node Y) of a driver circuit (e.g., H-bridge driver 100). In operation 704, a second current source (e.g., current source 124) coupled to a second current switch (e.g., current switch 118) at a ground terminal is also disabled for the first time period.

During a second time period ($t_d$), which is within but less than the first time period, operations 706, 708, 710 and 712 are performed. In operation 706, a third current source (e.g., current source 154) coupled to the second current switch at a second output node (e.g., bus output node Z) of the driver circuit is enabled for $t_d$. In operation 708, a fourth current source (e.g., current source 144) coupled to the first current switch at the first output node continues to operate for $t_d$. In operation 710, a first pull-down switch (e.g., pull-down switch 156) coupled between the first current switch and the ground terminal is enabled, and in operation 712, a second pull-down switch (e.g., pull-down switch 158) coupled between the second current switch and the ground terminal is enabled. Both pull-down switches 156 and 158 are enabled for $t_d$. In operation 714, after the first time period, during a third time period ($t_{comp}$), the third and fourth current sources may be disabled and a compensation current source (e.g., current source 148) is enabled. In operation 716, after the third time period ($t_{comp}$), the compensation current source is disabled.

FIG. 7 depicts one possible order of operations. Not all operations need necessarily be performed in the order described. Some operations may be combined into a single operation, which may be based on the time period in which they occur. For example, operations 702 and 704 may be considered a single operation. Similarly, operations 706, 708, 710 and 712 may be considered a single operation, or grouped based components, e.g., enabling of current sources and enabling of pull-down switches. Additional operations may be performed as well.

As the foregoing demonstrates, various examples of structure and/or functionality are provided to reduce or eliminate differential reverse leakage and/or discharge capacitance current in H-bridge drivers and similarly constructed components. For example, an additional P stack current source on one output side that remains operable after driver disable, a pre-charge current source on the other output side that is enabled during a pre-charge monopulse time period within the driver disable time period, and a pair of pull-down switches cooperate with each other and other driver components to reduce differential leakage current. In another aspect, compensation current is provided using an enabled compensation current source to offset or compensate for differential TVS diode capacitance-based discharge current. In examples, structure and/or functionality is provided to mitigate or eliminate polarity flip of the output voltage during drive disable or mode change to improve communication between an H-bridge driver and downstream components, e.g., a microcontroller.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronic or semiconductor component. Also, as used herein, the term "pre-charge" is relative to operation(s) that occur at a later period of time, i.e., the current compensation time period.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type MOSFET may be used in place of an n-type MOSFET, and vice versa, with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a signal ground, a digital ground, a common ground, and/or any other form of ground connection applicable to, or suitable for, the teachings of this description. Unless otherwise stated, "about," "approximately," and/or "substantially" preceding a value means +/−10 percent of the stated value.

Modifications of the described examples are possible, as are other examples, within the scope of the claims. For example, in an arrangement in which only one Y side, P stack current source is employed, i.e., the functionality of current sources 142 and 144 are combined into a single current source, that current source may be controlled to be partially enabled during the pre-charge monopulse time period ($t_d$) and then disabled during the current compensation time period ($t_{comp}$). Moreover, features described herein may be applied in other environments and applications consist with the teachings provided.

What is claimed is:

1. A driver circuit, comprising:
   at least one current source coupled between a supply voltage terminal and a first output node of the driver circuit, the at least one current source configured to supply a charge current during a pre-charge monopulse time period during and less than a driver disable time period when the driver circuit is disabled, the charge current being less than a current supplied by the at least one current source when the driver circuit is enabled;
   another current source coupled to a ground terminal of the driver circuit, the another current source configured to be disabled during the driver disable time period;
   a charge current source coupled between the supply voltage terminal and a second output node of the driver circuit, the charge current source configured to be enabled during the pre-charge monopulse time period;
   a first current switch coupled to the first output node, the first current switch having a control terminal and configured to be charged during the pre-charge monopulse time period;
   a second current switch coupled to the second output node, the second current switch having a control terminal and configured to be charged during the pre-charge monopulse time period;

a first pull-down switch coupled between the control terminal of the first current switch and ground, the first pull-down switch configured to be activated during the pre-charge monopulse time period; and a second pull-down switch coupled between the control terminal of the second current switch and ground, the second pull-down switch configured to be activated during the pre-charge monopulse time period.

2. The driver circuit of claim 1, wherein the at least one current source includes first and second current sources, the first current source configured to be disabled during the driver disable time period and the second current source configured to operate during the pre-charge monopulse time period to supply the charge current.

3. The driver circuit of claim 2, wherein, during the pre-charge monopulse time period, the current delivered by the second current source is greater than the current delivered by the charge current source.

4. The driver circuit of claim 3, wherein, during the pre-charge monopulse time period, each of a voltage at the first output node and a voltage at the second output node is controlled to be greater than a threshold voltage.

5. The driver circuit of claim 3, wherein the first current switch includes a source terminal coupled to the first output node, and the second current switch includes a source terminal coupled to the second output node.

6. The driver circuit of claim 5, wherein, during the pre-charge monopulse time period, the first pull-down switch is configured to discharge a voltage across the control terminal and source terminal of the first current switch, and the second pull-down switch is configured to discharge a voltage across the control terminal and source terminal of the second current switch.

7. The driver circuit of claim 1, wherein, during the pre-charge monopulse time period, a voltage signal applied to the control terminal of the first current switch is reduced and a voltage signal applied to the control terminal of the second current switch is reduced.

8. The driver circuit of claim 1, wherein the at least one current source and the charge current source are disabled for a compensation time period that occurs after the driver disable time period.

9. The driver circuit of claim 8, comprising:
a first compensation current source coupled between the supply voltage terminal and the first output node; and
a second compensation current source coupled between the supply voltage terminal and the second output node.

10. The driver circuit of claim 9, comprising:
a first transient-voltage-suppression (TVS) diode pair coupled between the first output node and ground; and
a second TVS diode pair coupled between the second output node and ground.

11. The driver circuit of claim 10, wherein one of the first and second compensation current source is enabled during the compensation time period based on a value of an input signal to the driver circuit.

12. The driver circuit of claim 11, wherein:
when the first compensation current source is enabled, the current delivered by the first compensation current source is greater than a difference between a second capacitance-based current flowing through the second TVS diode pair and a first capacitance-based current flowing through the first TVS diode pair; and
when the second compensation current source is enabled, the current delivered by the second compensation current source is greater than the difference between the first capacitance-based current flowing through the first TVS diode pair and the second capacitance-based current flowing through the second TVS diode pair.

13. The driver circuit of claim 10, wherein the compensation time period is set based on an expected maximum capacitance of the TVS diode pairs.

14. A method comprising:
disabling, for a first time period, a first current source coupled to a first current switch at a first output node of a driver circuit;
disabling, for the first time period, a second current source coupled to a second current switch at a ground terminal of the driver circuit;
enabling, for a second time period during and less than the first time period, a third current source coupled to the second current switch at a second output node of the driver circuit;
operating, for the second time period, a fourth current source coupled to the first current switch at the first output node;
enabling, for the second time period, a first pull-down switch coupled between the first current switch and the ground terminal; and
enabling, for the second time period, a second pull-down switch coupled between the second current switch and the ground terminal.

15. The method of claim 14, comprising:
disabling the third and fourth current sources during a third time period that occurs after the second time period; and
enabling, for the third time period, a compensation current source.

16. The method of claim 15, wherein the compensation current source delivers current during the third time period to compensate for differential capacitance-based current discharge from a pair of transient-voltage-suppression diode pairs of the driver circuit.

17. A driver circuit, comprising:
first and second current switches;
a first charge current source configured to deliver a charge current during a pre-charge monopulse time period during and less than a driver disable time period when the driver circuit is disabled;
a second charge current source configured to be enabled during the pre-charge monopulse time period, the first and second charge current sources configured to charge the first and second current switches during the pre-charge monopulse time period; and
first and second pull-down switches coupled to the first and second current switches, respectively, the first and second pull-down switches configured to be enabled during the pre-charge monopulse time period to discharge internal voltages of the first and second current switches, respectively.

18. The driver circuit of claim 17, comprising:
a first transient-voltage-suppression (TVS) diode pair coupled between a first output node of the driver circuit and ground;
a second TVS diode pair coupled between a second output node of the driver circuit and ground; and
two compensation current sources, one or the other of which is configured to be enabled during a compensation time period during which the charge current sources are disabled, the compensation time period being after the enable period.

19. The driver circuit of claim 18, wherein the two compensation current sources include a first compensation current source coupled to the first TVS diode pair and a second compensation current source coupled to the second TVS diode pair.

20. The driver circuit of claim 19, wherein, when the first compensation current source is enabled during the compensation time period, the current delivered by the first compensation current source is greater than a difference between a second capacitance-based current flowing through the second TVS diode pair and a first capacitance-based current flowing through the first TVS diode pair.

21. The driver circuit of claim 19, wherein, when the second compensation current source is enabled during the compensation time period, the current delivered by the second compensation current source is greater than the difference between the first capacitance-based current flowing through the first TVS diode pair and the second capacitance-based current flowing through the second TVS diode pair.

\* \* \* \* \*